(12) United States Patent
Palmieri et al.

(10) Patent No.: US 9,341,667 B2
(45) Date of Patent: May 17, 2016

(54) DEVICE FOR DETECTING AND MEASURING AN INSULATION FAULT

(71) Applicant: RENAULT s.a.s., Boulogne-Billancourt (FR)

(72) Inventors: Michael Palmieri, Grenoble (FR); Sebastien Carcouet, Vif (FR); Daniel Chatroux, Teche (FR); Lionel Cordesses, Montigny-le-Bretonneux (FR); Michel Mensler, Montigny-le-Bretonneux (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 0 days.

(21) Appl. No.: 14/425,214

(22) PCT Filed: Aug. 26, 2013

(86) PCT No.: PCT/FR2013/051967
§ 371 (c)(1),
(2) Date: Mar. 2, 2015

(87) PCT Pub. No.: WO2014/033397
PCT Pub. Date: Mar. 6, 2014

(65) Prior Publication Data
US 2015/0219707 A1 Aug. 6, 2015

(30) Foreign Application Priority Data
Aug. 30, 2012 (FR) .................................. 12 58089

(51) Int. Cl.
*H02P 1/00* (2006.01)
*G01R 31/02* (2006.01)
(Continued)

(52) U.S. Cl.
CPC ........... *G01R 31/025* (2013.01); *B60L 11/1803* (2013.01); *G01R 31/006* (2013.01);
(Continued)

(58) Field of Classification Search
CPC .... G01R 31/025; G01R 31/14; B60L 3/0069; B60L 11/1803; B60L 3/0023; B60L 3/0046; H02K 11/001; H02P 27/06

USPC ................. 318/139, 722, 812, 479, 490, 504; 324/509, 510, 511, 522, 524, 527; 361/42, 56, 59, 65
See application file for complete search history.

(56) References Cited

U.S. PATENT DOCUMENTS

| 6,992,490 B2 * | 1/2006 | Nomoto | ................. B60L 3/0023 324/509 |
| 7,292,042 B2 * | 11/2007 | Morita | .................. B60L 3/0023 324/509 |

(Continued)

FOREIGN PATENT DOCUMENTS

WO    WO 2012/036498 A2    3/2012

OTHER PUBLICATIONS

International Search Report issued Oct. 14, 2013 in PCT/FR2013/051967 Filed Aug. 26, 2013.
French Preliminary Search Report issued May 28, 2013 in Patent Application No. FR 12 58089 Filed Aug. 30, 2012 (with English translation of categories of cited documents).

*Primary Examiner* — Bentsu Ro
*Assistant Examiner* — Thai Dinh
(74) *Attorney, Agent, or Firm* — Oblon, McClelland, Maier & Neustadt, L.L.P.

(57) ABSTRACT

A device for detecting an insulation fault of a direct voltage source that can induce electrocution, including: first and second input terminals for the voltage source; first and third resistive dipoles connected in series between an electric ground and the second input terminal, the first resistive dipole having a resistance at least ten times higher than that of the third dipole; a second resistive dipole and a switch connected in series between the first input terminal and the electric ground; and a detection circuit connected to the terminals of the third dipole, configured to alternately open and close the switch, measure the voltage at the terminals of the third dipole, and determine the amplitude of an insulation fault according to the measured voltages.

9 Claims, 5 Drawing Sheets

(51) Int. Cl.
*G01R 31/00* (2006.01)
*B60L 11/18* (2006.01)
*G01R 31/14* (2006.01)
*H02K 11/00* (2016.01)
*H02P 27/06* (2006.01)
*B60L 3/00* (2006.01)

(52) U.S. Cl.
CPC .............. *G01R31/024* (2013.01); *G01R 31/14* (2013.01); *H02K 11/001* (2013.01); *H02P 27/06* (2013.01); *B60L 3/0069* (2013.01)

(56) References Cited

U.S. PATENT DOCUMENTS

| | | | |
|---|---|---|---|
| 7,808,245 B2 * | 10/2010 | Lindsey | G01R 31/025 324/510 |
| 8,373,950 B2 * | 2/2013 | Yano | B60L 3/0023 361/42 |
| 8,891,210 B2 * | 11/2014 | Itou | H02P 27/06 318/139 |
| 2004/0212371 A1 | 10/2004 | Nomoto et al. | |
| 2013/0176041 A1 | 7/2013 | Yang | |

* cited by examiner

Fig. 1
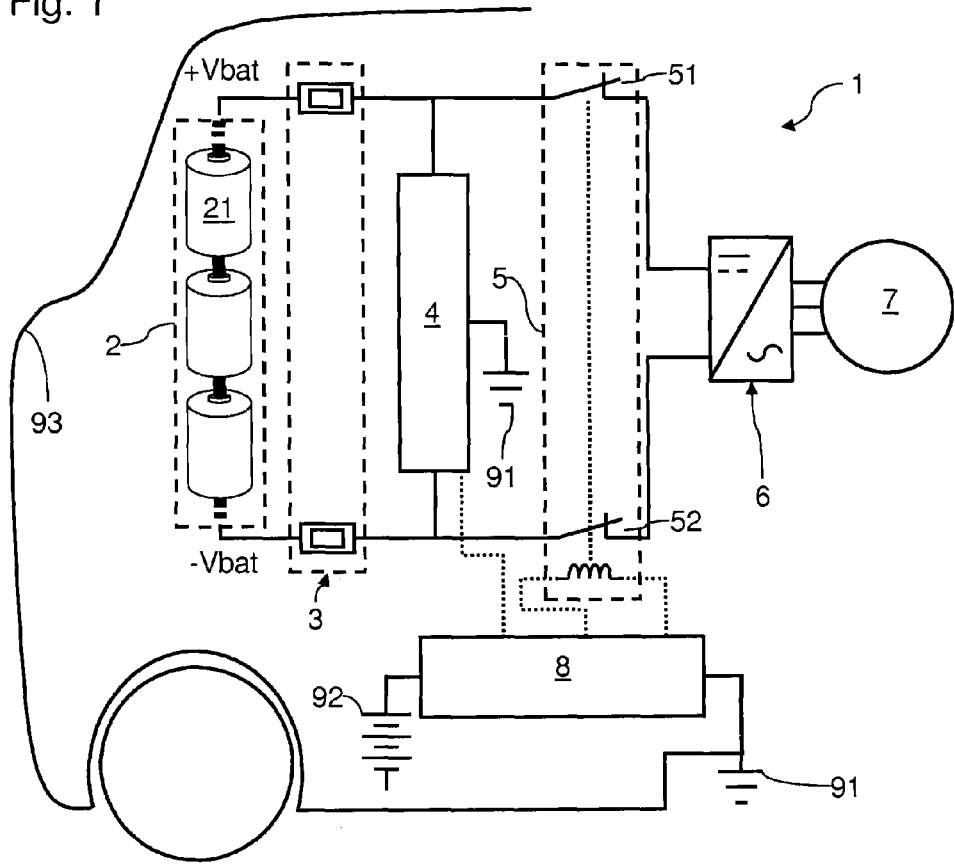
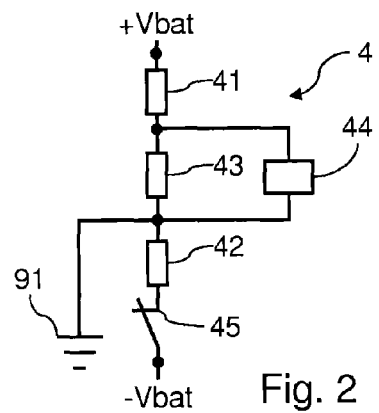
Fig. 2
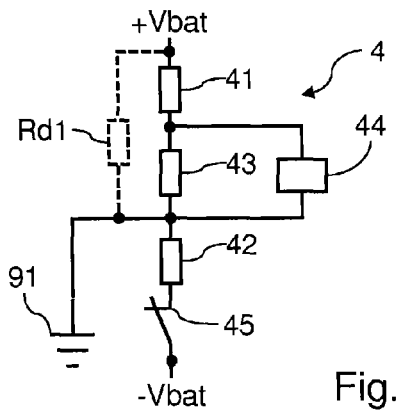
Fig. 3

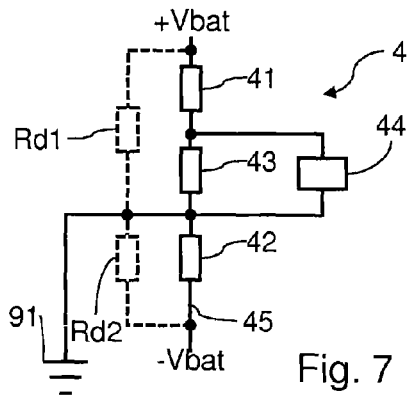

Fig. 7

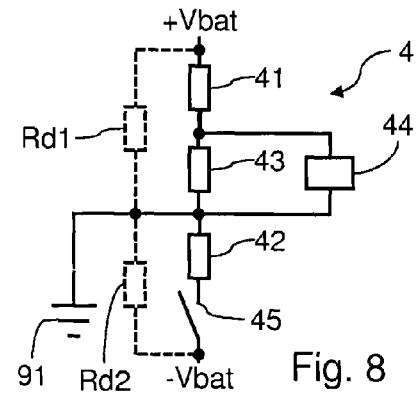

| RD1 Ω | RD2 Ω → | 100 | 1K | 10K | 100K | 1M | 10M | 100M | Inf |
|---|---|---|---|---|---|---|---|---|---|
| 100 | RD1 | Det | Det | Det | Det | Det | Det | Det | Det |
|  | RD2 | Det | Det | Det | Imp | Imp | X | X | X |
| 1K | RD1 | Det | Det | Mes | Mes | Mes | Mes | Mes | Mes |
|  | RD2 | Det | Det | Mes | Mes | Mes | NDet | NDet | Ndet |
| 10K | RD1 | X | Det | Mes | Mes | Mes | Mes | Mes | Mes |
|  | RD2 | Det | Det | Mes | Mes | Mes | Mes | NDet | Ndet |
| 100K | RD1 | X | X | Mes | Mes | Mes | Mes | Mes | Mes |
|  | RD2 | Det | Det | Mes | Mes | Mes | Mes | Mes | Ndet |
| 1M | RD1 | X | X | X | Mes | Mes | Mes | Mes | Mes |
|  | RD2 | Det | Det | Det | Mes | Mes | Mes | Mes | Ndet |
| 10M | RD1 | X | X | X | Mes | Mes | Mes | Mes | Mes |
|  | RD2 | Det | Det | Det | Mes | Mes | Mes | Mes | Ndet |
| 100M | RD1 | X | X | X | Mes | Mes | Mes | Mes | Mes |
|  | RD2 | Det | Det | Det | Mes | Mes | Mes | Mes | Ndet |
| Inf | RD1 | X | X | X | NDet | NDet | NDet | NDet | NDet |
|  | RD2 | Det | Det | Det | Mes | Mes | Mes | Mes | Ndet |

Fig. 10

| RD1 Ω | RD2 Ω → | 100 | 1K | 10K | 100K | 1M | 10M | 100M | Inf |
|---|---|---|---|---|---|---|---|---|---|
| 100 | RD1 | Det | Mes | Mes | Mes | Mes | Mes | Mes | Mes |
|  | RD2 | Det | Mes | Mes | Mes | Imp | NDet | NDet | Ndet |
| 1K | RD1 | Det | Mes | Mes | Mes | Mes | Mes | Mes | Mes |
|  | RD2 | Det | Mes | Mes | Mes | Mes | NDet | NDet | Ndet |
| 10K | RD1 | X | Mes | Mes | Mes | Mes | Mes | Mes | Mes |
|  | RD2 | Det | Mes | Mes | Mes | Mes | Mes | NDet | Ndet |
| 100K | RD1 | X | X | Mes | Mes | Mes | Mes | Mes | Mes |
|  | RD2 | Det | Det | Mes | Mes | Mes | Mes | Mes | Ndet |
| 1M | RD1 | X | X | Mes | Mes | Mes | Mes | Mes | Mes |
|  | RD2 | Det | Det | Mes | Mes | Mes | Mes | Mes | Ndet |
| 10M | RD1 | X | X | Imp | Mes | Mes | Mes | Mes | Mes |
|  | RD2 | Det | Det | Mes | Mes | Mes | Mes | Mes | Ndet |
| 100M | RD1 | X | X | NDet | Mes | Mes | Mes | Mes | Mes |
|  | RD2 | Det | Det | Mes | Mes | Mes | Mes | Mes | Ndet |
| Inf | RD1 | X | X | NDet | NDet | NDet | NDet | NDet | NDet |
|  | RD2 | Det | Det | Mes | Mes | Mes | Mes | Mes | Ndet |

DEVICE FOR DETECTING AND MEASURING AN INSULATION FAULT

The invention relates to the insulation of a DC voltage network or electrical supply with respect to a reference voltage.

High-power DC electrical systems have undergone significant development. Specifically, numerous transport systems include a DC supply.

Hybrid combustion/electrical or electrical vehicles include in particular high-power batteries. In order to obtain the appropriate voltage level, a plurality of electrochemical accumulators are placed in series. In order to obtain high powers and capacities, a plurality of groups of accumulators are placed in series. The number of stages (number of groups of accumulators) and the number of accumulators in parallel in each stage vary according to the voltage, the current and the capacity which are desired for the battery. The combination of a plurality of accumulators is referred to as a battery of accumulators.

Such batteries are used to drive an AC electric motor via an inverter. The voltage levels necessary for such motors reach several hundreds of volts, typically of the order of 400 volts. Such batteries also have a high capacity in order to promote the range of the vehicle in electrical mode. Several technical reasons specific to the automobile application lead to the use of insulation between the mechanical ground of the vehicle (formed by the metal chassis and body of the vehicle and therefore accessible to the user) and the potentials of the battery. The main reason is that it is not envisionable to disconnect the traction battery instantaneously in the event of a first insulation fault during driving. For example, in the case when one of the poles of the battery is connected to the mechanical ground and the insulation fault appears on the other pole. This leads to a short circuit and immediate blowing of the protective fuse. The effect of this would be to make the vehicle dangerous because of the absence of traction power or recuperative braking. This therefore makes it necessary to insulate the battery and monitor this insulation for reasons of human safety by an insulation monitor. Specifically, if there is no risk for the user in the event of a first fault, it is expedient to report this first fault before the occurrence of a second fault which would lead to disconnection of the traction battery because it causes a short circuit between the positive and negative terminals of the battery. Furthermore, in the event of this second fault, the voltage of the battery would be directly connected to the mechanical ground of the vehicle and the user would therefore be potentially in contact therewith. Because of the potential risk of such an energy source for users, particular care must be taken of the insulation and the monitoring of the insulation between the battery and the mechanical ground. Any part of the vehicle electrically connected to the battery must be insulated from the ground. This insulation is produced by using insulating materials. The insulation may degrade over time (because of vibrations, mechanical impacts, dust, etc.) and therefore place the mechanical ground at a dangerous potential.

Furthermore, it may be envisioned to use a charger not DC-isolated from the electrical network. Since the mechanical ground of the vehicle is by regulation connected to the earth during recharging and the neutral mode (TT mode) conventionally used residentially connects the neutral to the earth, this is equivalent to connecting the mechanical ground of the vehicle to one of the potentials of the battery during recharges. During these recharges, the full voltage of the battery is therefore applied to the terminals of the insulation, in contrast to the nominal case in which only half this voltage is applied, and above all monitored. This insulation might not be capable of taking the full voltage, creating a second fault instantaneously leading to a short circuit.

An electrical vehicle according to the prior art typically has a battery intended to supply a three-phase electric motor. The battery comprises electrochemical accumulators. A protective device provided with fuses is connected to the terminals of the battery. An insulation monitoring device is also connected to the terminals of the battery, and connected to the mechanical ground of the vehicle. The insulation monitoring device is connected to a computer in order to signal the detected insulation faults thereto. This computer is supplied by an on-board network battery. The negative pole of this battery is connected to the ground of the vehicle. The terminals of the battery apply voltages +Vbat and −Vbat to the DC inputs of an inverter via a cutoff system. The cutoff system comprises power contactors controlled by the computer. The electric motor is connected to the AC output of the inverter. Various types of insulation monitoring are known in the prior art.

Because of ageing, some insulation materials may prove suitable for withstanding the voltage between the mechanical ground and a terminal of the battery during normal operation, but may break down when they are subjected to the full voltage between the terminals of the battery because of an insulation fault.

The known monitoring devices do not make it possible to test and detect such a potential insulation fault, which may lead to chained insulation faults. A first insulation fault on one polarity applies the full voltage between the other polarity and the ground. If the insulation of this other polarity is not capable of withstanding it, the second insulation fault occurs. This creates a short circuit with blowing of the fuses. This corresponds to a loss of traction then sudden locking of the vehicle, which is dangerous.

None of the known insulation monitors is satisfactory with the industrial constraints encountered. None of the known insulation monitors makes it possible to detect an insulation fault, determine which polarity of the battery is affected by the insulation fault, determine whether both polarities are affected by an insulation fault and measure the amplitude of an insulation fault, without inducing excessive electrical consumption and with a cost compatible with the sale price expected for the vehicle marketed on a large scale to the public.

The invention aims to solve one or several of these drawbacks. The invention thus relates to a device for detecting an insulation fault of a DC voltage source liable to induce an electrocution, comprising:
  first and second input terminals intended to be connected to the terminals of the voltage source;
  first and third resistive dipoles connected in series between an electrical ground and the second input terminal, the first resistive dipole having a resistance at least ten times greater than that of the third dipole;
  a second resistive dipole and a switch, which are connected in series between the first input terminal and the electrical ground;
  a detection circuit connected to the terminals of the third dipole, the detection circuit being configured in order to:
  open and close said switch alternately;
  measure the voltage across the terminals of the third dipole when the switch is open and when the switch is closed;
  determine the amplitude of an insulation fault as a function of the voltages measured.

According to one variant, the resistance of the first dipole is at least three times greater than the resistance of the second dipole.

According to another variant, the third dipole is a potentiometer or a network of switched resistors.

According to yet another embodiment, the detection circuit closes said switch repeatedly with a time interval between 2 and 30 seconds.

According to another variant, the detection circuit keeps the switch closed with a duty cycle of less than or equal to 2%.

According to yet another variant, said switch includes an optocoupler controlled by the detection circuit.

According to one variant, the resistance of the first dipole and the resistance of the second dipole are each at least equal to 50 kΩ.

The invention furthermore relates to a motorization system comprising:
- a detection device as described above;
- a battery, the terminals of which are connected to the first and second input terminals of the detection device;
- an inverter having a DC interface and an AC interface, the terminals of the battery being connected to the DC interface;
- an electric motor connected to the AC interface of the inverter.

According to one variant, the voltage across the terminals of the battery is greater than 100 V.

According to one variant, the detection circuit controls the resistance of the potentiometer so that this resistance is proportional to the voltage across the terminals of the battery.

Other characteristics and advantages of the invention will become clear from the description given below by way of indication and without any limitation, with reference to the appended drawings in which:

FIG. 1 is a schematic representation of an example of a vehicle with an electric motor supplied by a battery;

FIG. 2 is a schematic representation of a device for detecting and measuring an insulation fault according to an embodiment of the invention;

FIG. 3 illustrates the detection and measurement device of FIG. 2 in the context of a first type of insulation fault;

FIGS. 7 and 8 illustrate the operation of the device for detecting an insulation fault when there is a double fault;

FIGS. 9 and 10 illustrate operating results of two variants of the device for detecting and measuring an insulation fault;

Figure 4:
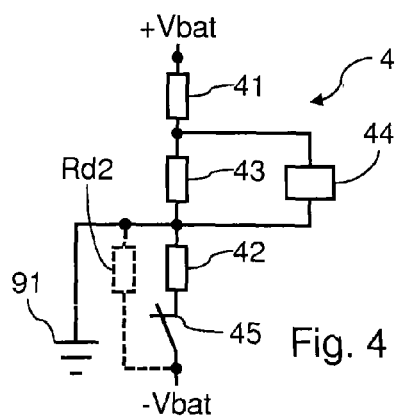
FIG. 4 illustrates the detection and measurement device of FIG. 2 in the context of a second type of insulation fault.

The invention provides a device for detecting and measuring an insulation fault of a DC voltage source liable to induce an electrocution. This device comprises first and second input terminals connected to the terminals of the voltage source.

FIG. 1 illustrates an example of a vehicle 1 implementing an embodiment of the invention. The vehicle 1 is an electrical vehicle comprising, in a manner known per se, a battery 2 including electrochemical accumulators 21 connected in seriels. The battery 2 comprises a large number of accumulators connected in series, typically between 40 and 150 accumulators, depending on the required voltage and the type of accumulators used. The voltage across the terminals of battery 2 when charged is typically of the order of 400 V. The battery 2 applies a voltage +Vbat to a first terminal and a voltage −Vbat to a second terminal. The accumulators 21 are connected in series by means of power electrical connections. The terminals of the battery 2 are connected to a DC interface of an inverter 6. An electric motor 7 is connected to an AC interface of the inverter 6.

The connection between the terminals of the battery 2 and the DC interface of the inverter 6 is produced by means of a protective circuit 3 and by means of a power coupling circuit 5. The protective circuit 3 may comprise, in a manner known per se, fuses configured to open the connection in the event of a short circuit. The power coupling circuit 5 comprises switches 51 and 52 making it possible to selectively connect/disconnect the terminals of the battery 2 to/from the DC interface of the inverter 6. The opening/closing of the switches and 52 is controlled by a control circuit 8, typically a computer for monitoring the operation of the battery 2. The control circuit 8 is typically supplied by means of a supply battery 92 of the on-board network of the vehicle 1, having a voltage level very much lower than that of the battery 2. The control circuit 8 is typically connected to the mechanical ground 91, including the metal chassis and body 93 of the vehicle 1.

A device for detecting and measuring an insulation fault 4 is connected to the terminals of the battery 2 and to the mechanical ground 91. An embodiment of such a detection device 4 is detailed schematically in FIG. 2.

The detection and measurement device 4 comprises input terminals +Vbat and −Vbat to which the voltages +Vbat and −Vbat of the battery are respectively applied by means of power connections. The device 4 includes first, second and third resistive dipoles 41, 42 and 43. The resistive dipoles 41 and 43 are connected in series between the mechanical ground 91 and the input terminal +Vbat. The resistive dipole 42 is connected in series with a switch 45 between the input terminal −Vbat and the mechanical ground 91.

The voltage across the terminals of the battery 2 will be denoted below by Vbat, and the respective resistances of the dipoles 41, 42 and 43 will be denoted by R1, R2 and R3.

A detection and measurement circuit 44 is connected to the terminals of the third dipole 43. The detection and measurement circuit 44 is configured in order to open and close the switch 45 alternately. The detection and measurement circuit 44 measures the voltage across the terminals of the dipole 43 and is configured to deduce therefrom the presence of an insulation fault, the polarity of this insulation fault and/or the amplitude of this insulation fault.

FIG. 3 illustrates the equivalent circuit diagram of the device 4 when there is an insulation fault which can be likened to a resistance Rd1 between the terminal +Vbat and the mechanical ground 91. FIG. 4 illustrates the equivalent circuit diagram of the device 4 when there is an insulation fault which can be likened to a resistance Rd2 between the terminal −Vbat and the mechanical ground 91. Such a device 4 proves particularly suitable for a power battery, the rated voltage of which is typically higher than 100 V.

In practice, the maximum voltage across the terminals of the dipole 43 is reached when there is a short circuit between the mechanical ground 91 and the terminal −Vbat. In order to limit the voltage applied to the input of the detection and measurement circuit 4, the resistance of the dipole 41 is at least 10 times greater than the resistance of the dipole 43. For a desired voltage range VoutMax at the terminals of the circuit 44, R3 may be determined as follows:

$$R3 = (R1 * VoutMax)/(Vbat - VoutMax)$$

VoutMax will advantageously be less than or equal to 3.5 V in order to make it possible to employ commonly used low-cost electronic components in the circuit 44.

Furthermore, the dipole 43 to the terminals of which the detection and measurement circuit 44 is connected is advantageously connected between the ground 91 and the positive terminal of the battery 2, so that the detection and measurement circuit 44 measures only positive voltages. The circuit 44 makes it possible to measure an insulation fault for the terminals of opposite polarity, and to do so with a measurement voltage Vout whose sign remains unchanged.

The dipole 43 is advantageously connected to the mechanical ground 91. The switch 45 is advantageously connected to the mechanical ground 91.

When the switch 45 is closed, if there is an insulation fault Rd1 only between the terminal +Vbat and the ground 91, the voltage Vout applied to the terminals of the circuit 44 will then be:

$$Vout = Vbat * \frac{R3}{R1+R3} * \frac{\frac{(R1+R3)*Rd1}{R1+R3+Rd1}}{\frac{(R1+R3)*Rd1}{R1+R3+Rd1}+R2}$$

When the switch 45 is closed, if there is an insulation fault Rd2 only between the terminal −Vbat and the ground 91, the voltage Vout applied to the terminals of the circuit 44 will then be:

$$Vout = Vbat * \frac{R3}{R1+R3+\frac{R2*Rd2}{R2+Rd2}}$$

In these two figurative cases, the amplitude of the insulation faults can be deduced therefrom:

$$Rd1 = \frac{R2*(R1+R3)}{R1+R2+R3-\frac{Vbat*R3}{Vout}}$$

$$Rd2 = -\frac{R2*\left(\frac{Vbat*R3}{Vout}-R1-R3\right)}{R1+R2+R3-\frac{Vbat*R3}{Vout}}$$

The measurement of the amplitude of an insulation fault is thus based on the amplitude of the DC component of the voltage across the terminals of the dipole 43.

Figure 5:
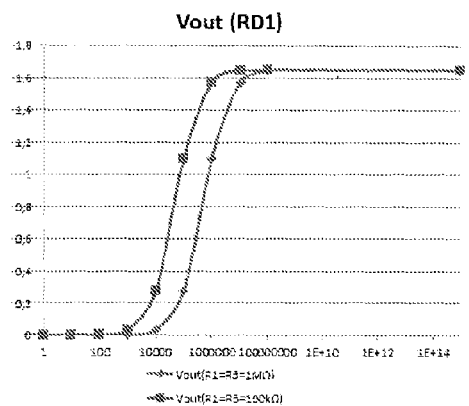
FIGS. 5 and 6 illustrate sensitivity diagrams of a detection device as a function of different resistance values.
Figure 6:
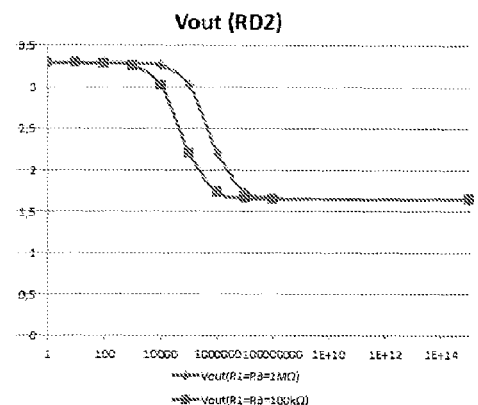

FIGS. 5 and 6 illustrate the voltage across the terminals of the detection and measurement circuit 44 as a function of the amplitude of the insulation faults Rd1 or Rd2 for different values of the resistances of the dipoles 41 and 42. For these measurements, the switch 45 is closed. In these various figurative cases, the resistance R1 is at least 100 times greater than the resistance R3. R3 is dimensioned here so that Vout-Max=3.3 V. In these various figurative cases, R1=R2.

The diagram shows that the circuit 44 has a range in which an insulation fault is not detected (insulation fault of too low an amplitude), a measurement range (an insulation fault amplitude can be determined) and a detection range (an insulation fault can be identified but its amplitude cannot).

It can be seen that an increase in the values of R1 and R2 makes it possible to detect an insulation fault earlier. The increase in the values of R1 and R2 also increases the transition threshold between the measurement range and the detection range. Consequently, the values of R1 and R2 will advantageously be selected as a function of the transition threshold between the measurement range and the non-detection range and as a function of the extent desired for the measurement range.

In practice, alternate opening/closing of the switch 45 makes it possible to increase the extent of the measurement range of the circuit 44. The alternate opening and closing of the switch 45 furthermore makes it possible to detect the simultaneous presence of insulation faults on the side of the terminal −Vbat and on the side of the terminal +Vbat. The switch 45 makes it possible to avoid an inaccuracy or a lack of detection of insulation faults by compensating for the insulation faults on either side of the mechanical ground 91.

When the switch 45 is closed, the voltage Vout1 across the terminals of the dipole 43 is given by the following formula:

$$Vout1 = Vbat * \frac{R3}{R1+R3} * \frac{\frac{(R1+R3)*Rd1}{R1+R3+Rd1}}{\frac{(R1+R3)*Rd1}{R1+R3+Rd1}+\frac{R2*Rd2}{R2+Rd2}}$$

When the switch 45 is open, the voltage Vout2 across the terminals of the dipole 43 is given by the following formula:

$$Vout2 = Vbat * \frac{R3}{R1+R3} * \frac{\frac{(R1+R3)*Rd1}{R1+R3+Rd1}}{\frac{(R1+R3)*Rd1}{R1+R3+Rd1}+R2}$$

A system of two equations with two unknowns is thus obtained, which gives the following solutions:

$$Rd1 = -\frac{R2*R13*\left[\begin{array}{c}Vout2*(Vb3-R13*Vout1)- \\ Vout1*(Vb3-R13*Vout2)\end{array}\right]}{\begin{array}{c}Vout1*R2(Vb3-R13*Vout2)- \\ (Vb3-(R13-R2)Vout2)(Vb3-R13*Vout1)\end{array}}$$

With R13=R1+R3 and Vb3=Vbat*R3

$$Rd2 = \frac{Rd1*(Vbat*R3-(R1+R3)*Vout2)}{Vout2*(R1+R3+Rd1)}$$

Consequently, so long as an insulation fault on one or other side of the mechanical ground 91 does not have a resistance below the transition threshold of the detection range, the circuit 44 is capable of providing a measurement of the amplitude of the insulation faults Rd1 and Rd2.

When the switch 45 is open, in the absence of an insulation fault the voltage Vout1 is zero. The electrical consumption of the dipoles 41 to 43 is then also zero. The voltage Vout1 then increases only when an insulation fault Rd2 occurs.

In order to limit the consumption during the closure of the switch 45, the latter may be kept closed with a duty cycle less than or equal to 2%. Furthermore, the resistors R1 and R2 will advantageously each be equal to at least 50 kΩ. The closing of the switch 45 may be repeated with a time interval between 2 and 30 seconds.

In order to determine the amplitude of the insulation fault, the circuit 44 may carry out digital encoding of the voltage Vout measured. For example, the voltage measurement Vout may be encoded over 12 bits by means of a sampler at the input of the circuit 44. The size of the encoding word will, of course, be adapted to the precision desired for the measurement.

Tests have been carried out with insulation faults Rd1=50 kΩ and Rd2=1 MΩ, for resistances R1 and R2 of 1 MΩ. The circuit 44 has made it possible to obtain measurements of Rd1 and Rd2 with an error of less than 10%, with encoding of the measurement Vout over 12 bits, 10 bits or 8 bits.

Tests have been carried out with insulation faults Rd1=Rd2=100 kΩ, for resistances R1 and R2 of 1 MΩ. The circuit 44 has made it possible to obtain measurements of Rd1 and Rd2 with an error of less than 2%, with encoding of the measurement Vout over 12 bits, 10 bits or 8 bits.

If a fault occurs in one of the cells included in the battery, the voltages Vbat and Vout will vary. A short circuit with the mechanical ground 91 in the middle of the series connection of cells does not modify the potential of the mechanical ground 91. Conversely, opening of the switch 45 makes it possible to identify such a short circuit. Specifically, in the absence of a short circuit, there would be there would be a voltage Vout2 of zero. In the presence of such a short circuit, the following value is obtained:

$$Vout2 = +Vbat*R3/(R1+R3)$$

The presence of such a short circuit can therefore be determined on the basis of a deviation of Vout2 from the expected value.

The invention proves particularly advantageous when the resistance R1 is greater than the resistance R2, for example when R1 is at least equal to two times R2, preferably when R1 is at least equal to three times R2.

In practice, this makes it possible to substantially broaden the extent of the measurement range. Furthermore, such a difference in resistance makes it possible to apply a voltage close to the voltage Vbat between each terminal −Vbat and +Vbat of the battery and the mechanical ground 91 in order to test the strength of the insulation. In the absence of too great an insulation fault, when the switch 45 is open, substantially the voltage Vbat is applied between the terminal −Vbat and the mechanical ground 91. When the switch 45 is closed, because of the difference between the resistances R1 and R2, a voltage close to Vbat is applied between the terminal +Vbat and the mechanical ground 91. These advantages are obtained without inducing extra cost for the components of the device 4.

Because of this large difference in resistance, the variation of the voltage Vout1 is increased in the absence of an insulation fault Rd2. When there is an insulation fault R2, a low value of the resistance R2 allows greater measurement sensitivity of this insulation fault Rd2.

The tables of FIGS. 9 and 10 correspond to simulations carried out respectively with identical resistances R1 and R2 (1 MΩ) and different resistances R1 and R2 (1 MΩ and 100 kΩ, respectively). The voltage measurement Vout is encoded over 12 bits for these simulations.

The table illustrates the results for different value combinations of the insulation faults Rd1 and Rd2.

The following notation is used:
Mes: insulation fault identified and amplitude measured with an error of less than 200;
NDet: insulation fault not identified;
Det: insulation fault detected but not measured, or measured with an error greater than 200;
Imp: detection error or non-detection;
X: measurement impossible.

It can be seen that a precise measurement of an insulation fault having a low resistance is not carried out, but such precision for an insulation fault is not necessary because it is an insulation fault whose amplitude is in any event not severe.

It can also be seen that the different values of the resistances R1 and R2 make it possible to obtain a precise measurement in a larger number of cases (fault measurements for resistances ten times less), a reduced number of impossible measurements, and a reduced number of erroneous detections. In all cases, the predominant insulation fault is detected.

The use of a resistance R2 of lower value combined with the presence of a switch 45 in series makes it possible in any event to limit the electrical consumption of the device 4 while benefiting from the advantages of such a difference between the resistances R1 and R2. The resistance R2 advantageously has a sufficiently high value to be able to measure insulation faults Rd1 having high resistance values precisely.

The dipole 43 may be implemented in the form of a potentiometer or switched resistors, the resistance value of which is set by a control circuit proportional to the voltage Vbat at the terminals of the battery 2. The insulation fault measurement can thus take into account variations in the load of the battery 2. The measurement resolution can thus be the same regardless of the load of the battery 2. The dipole 43 may, for example, be implemented in the form of a digital potentiometer. Such a potentiometer may comprise a component whose resistance is fixed, in series with a component whose resistance is variable as a function of the value range desired for the resistance R3. Advantageously, the dipoles 41 and 42 may be potentiometers. Thus, measurement range extents can be modified by altering these resistance values.

Figure 11:
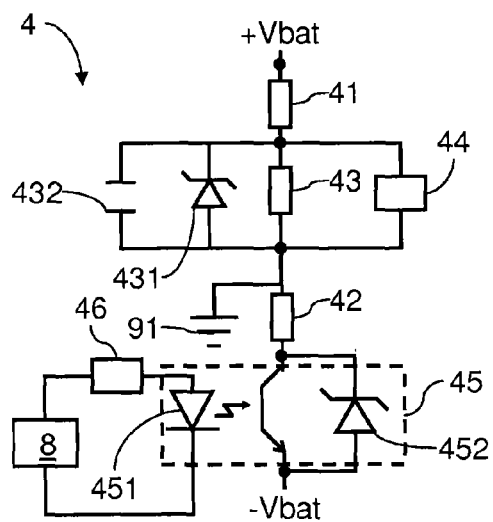
FIGS. 11 to 14 illustrate different variants of devices for detecting an insulation fault.
Figure 12:
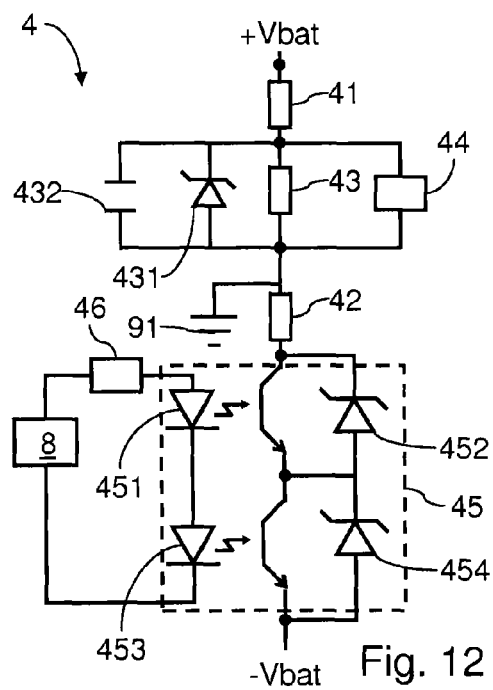
Figure 13:
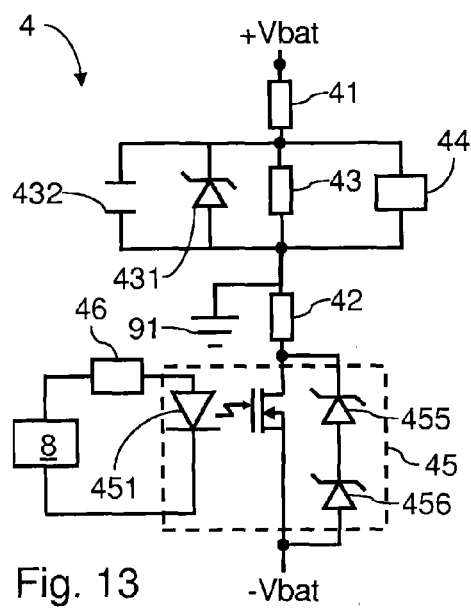

FIGS. 11 to 13 illustrate different variants of devices for detecting an insulation fault, in which the switch 45 includes an optocoupler. The use of an optocoupler makes it possible to isolate the control of the switch 45 from the dipoles 41 to 43 to the terminals of which a high voltage is applied.

In these different variants, a Zener diode 431 is connected in parallel with the third dipole 43. This diode 431 makes it possible to avoid overvoltages in the circuit 44, assuming there is a significant insulation fault. In these different variants, a capacitor 432 is connected in parallel with the third dipole 43. The capacitor 432 makes it possible to filter the voltage across the terminals of the dipole in order to eliminate the high-frequency perturbations.

In the variant of FIG. 11, the switch 45 includes a single optocoupler 451. The optocoupler 451 uses a phototransistor of the bipolar type. A Zener diode 452 is connected in parallel with the optocoupler 451. The optocoupler 451 is used in saturation mode in order to fulfil the function of a switch. The optocoupler 451 is controlled by the control circuit 8 via a resistor 46. The Zener diode 452 protects the optocoupler 451 from possible overvoltages which may come from the elements connected to the battery 2, for example a motor inverter during driving or an electrical network during recharging. The Zener voltage of the diode 452 is less than the voltage VceMax of the optocoupler and greater than the voltage Vbat. The switch 45 is normally open in this case, the controlling of the switch 45 then not consuming energy at rest.

In the variant of FIG. 12, the switch 45 includes two optocouplers 451 and 453 connected in series. Such an arrangement makes it possible in particular to use relatively common power components, with batteries whose rated voltage Vbat is higher than 400 V. The optocouplers 451 and 453 use phototransistors of the bipolar type. A Zener diode 452 is connected in parallel with the optocoupler 451, and a Zener diode 454 is connected in parallel with the optocoupler 453. The Zener voltage of the diodes 452 and 454 is greater than Vbat/2. In this example, the diodes of the optocouplers 452 and 454 are connected in series. If the control voltage is not sufficient to drive the diodes in series, a parallel control circuit may be used.

In the variant of FIG. 13, the switch 45 includes an optocoupler 451 using a field-effect phototransistor. Because of better voltage strength of this type of optocoupler, a single optocoupler 451 can be used, even when the voltage Vbat is higher than 400 V. For such voltage levels, a plurality of Zener diodes 455 and 456 connected in series are used, in a branch connected in parallel with the phototransistor of the optocoupler 451.

Figure 14:
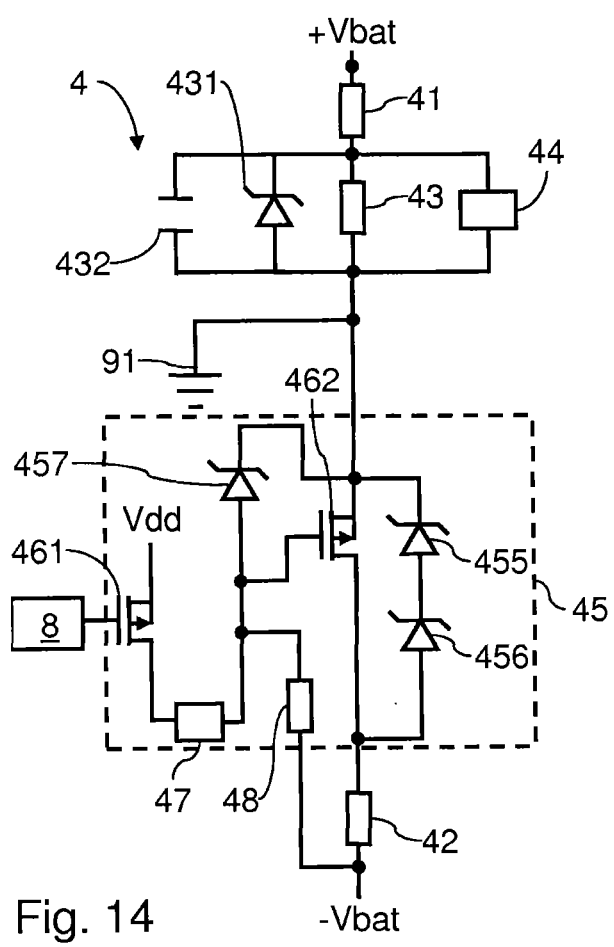

FIG. 14 illustrates another variant of a detection and measurement device 4, in which the control of the switch 45 may not be isolated from the dipoles 41 to 43. In this example, the switch 45 is connected between the dipole 42 and the mechanical ground 91.

The switch 45 includes a PMOS transistor 462 connected in series between the dipole 42 and the mechanical ground 91. A branch connected in parallel with the transistor 462 includes two Zener diodes 455 and 456 connected in series. A resistor 48 is connected between the terminal −Vbat and the gate of the transistor 462. A Zener diode 457 is connected between the gate of the transistor 462 and the mechanical ground 91. The switch furthermore includes an NMOS transistor 461, the gate of which is controlled by the control circuit 8. A supply voltage Vdd is applied to the drain of the transistor 461, and a resistor 47 is connected between the source of the transistor 461 and the gate of the transistor 462.

When the transistor 461 is open, the Zener diode 457 makes it possible to apply a negative voltage to the gate of the transistor 462 in order to bring it to saturation. When the transistor 461 is closed, the supply voltage Vdd is applied to the gate of the transistor 462 and thus leads to it being blocked.

For integration in an automobile 1, the monitoring of an insulation fault by the detection and measurement device 4 may be carried out when starting the vehicle and/or during driving.

The invention claimed is:

1. A device for detecting an insulation fault of a DC voltage source liable to induce an electrocution, comprising:
   first and second input terminals configured to be connected to terminals of the voltage source;
   first and third resistive dipoles connected in series between an electrical ground and the second input terminal, the first resistive dipole having a resistance at least ten times greater than that of the third dipole;
   a second electrical connection of a second resistive dipole and a switch, which are connected in series between the first input terminal and the electrical ground, the second electrical connection being connected directly to the first input terminal and to the electrical ground, the resistance of the first dipole being at least three times greater than the resistance of the second dipole;
   a detection circuit connected to the terminals of the third dipole, the detection circuit being configured to:
      open and close the switch alternately;
      measure a voltage across the terminals of the third dipole when the switch is open and when the switch is closed;
      determine an amplitude of an insulation fault as a function of the voltages measured.

2. The detection device as claimed in claim 1, wherein the third dipole is a potentiometer or a network of switched resistors.

3. The detection device as claimed in claim 1, wherein the detection circuit closes the switch repeatedly with a time interval between 2 and 30 seconds.

4. The detection device as claimed in claim 1, wherein the detection circuit keeps the switch closed with a duty cycle of less than or equal to 2%.

5. The detection device as claimed in claim 1, wherein the switch includes an optocoupler controlled by the detection circuit.

6. The detection device as claimed in claim 1, wherein the resistance of the first dipole and the resistance of the second dipole are each at least equal to 50 kΩ.

7. A motorization system comprising:
   a detection device as claimed in claim 1;
   a battery, the terminals of which are connected to the first and second input terminals of the detection device;
   an inverter having a DC interface and an AC interface, the terminals of the battery being connected to the DC interface;
   an electric motor connected to the AC interface of the inverter.

8. The motorization system as claimed in claim 7, wherein the voltage across the terminals of the battery is greater than 100 V.

9. The motorization system as claimed in claim 7, including a detection device, wherein the detection circuit controls the resistance of the potentiometer so that this resistance is proportional to the voltage across the terminals of the battery.

\* \* \* \* \*